United States Patent [19]
Lentini et al.

[11] Patent Number: 5,852,382
[45] Date of Patent: Dec. 22, 1998

[54] THREE-STATE CMOS OUTPUT BUFFER CIRCUIT

[75] Inventors: Franco Lentini, San Gregorio; Giorgio Catanzaro, Messina, both of Italy

[73] Assignee: Consorzio per la Ricerca sulla Microelettronica nel Mezzogiorno, Catania, Italy

[21] Appl. No.: 623,317

[22] Filed: Mar. 26, 1996

[30] Foreign Application Priority Data

Mar. 31, 1995 [EP] European Pat. Off. .............. 95830120

[51] Int. Cl.$^6$ ....................................................... H03K 3/01
[52] U.S. Cl. .............................. 327/534; 326/56; 327/112
[58] Field of Search ................................. 326/56, 57, 58; 327/108, 112, 530, 534

[56] References Cited

U.S. PATENT DOCUMENTS

| | | | |
|---|---|---|---|
| 5,160,855 | 11/1992 | Dobberpuhl | 326/21 X |
| 5,300,832 | 4/1994 | Rogers | 307/475 |
| 5,448,198 | 9/1995 | Toyoshima et al. | 326/81 X |
| 5,534,795 | 7/1996 | Wert et al. | 327/534 |
| 5,539,335 | 7/1996 | Kobayashi et al. | 326/81 |
| 5,546,020 | 8/1996 | Lee et al. | 327/534 |
| 5,552,723 | 9/1996 | Shigehara et al. | 327/534 |
| 5,646,550 | 7/1997 | Campbell, Jr. et al. | 326/81 |

FOREIGN PATENT DOCUMENTS

| | | | |
|---|---|---|---|
| A-0 556 605 | 8/1993 | European Pat. Off. | H03K 19/01 |
| A-0 621 692 | 10/1994 | European Pat. Off. | H03K 19/00 |

Primary Examiner—Timothy P. Callahan
Assistant Examiner—Jeffrey Zweizig
Attorney, Agent, or Firm—Wolf, Greenfield & Sacks, P.C.

[57] ABSTRACT

A three-state CMOS output buffer circuit includes a final amplifier stage having a pull-up transistor and a pull-down transistor connected between a voltage supply and ground and having a common output node, and a control circuitry for driving the final amplifier stage including a first logic gate supplied with an input data signal and an enable/disable signal for activating a three-state mode in which the pull-up transistor and the pull-down transistor are both deactivated, the first logic gate driving the pull-up transistor, a second logic gate supplied with said input data signal and enable/disable signal, the second logic gate driving the pull-down transistor. The pull-up transistor has a bulk electrode connected to a switchable bulk line; an auxiliary circuit is provided which as long as a voltage of the output node is not higher than said supply voltage keeps said switchable bulk line connected to the voltage supply. The first logic gate includes circuitry for transferring the voltage of the output node to said switchable bulk line when the voltage of the output node exceeds the supply voltage.

17 Claims, 1 Drawing Sheet

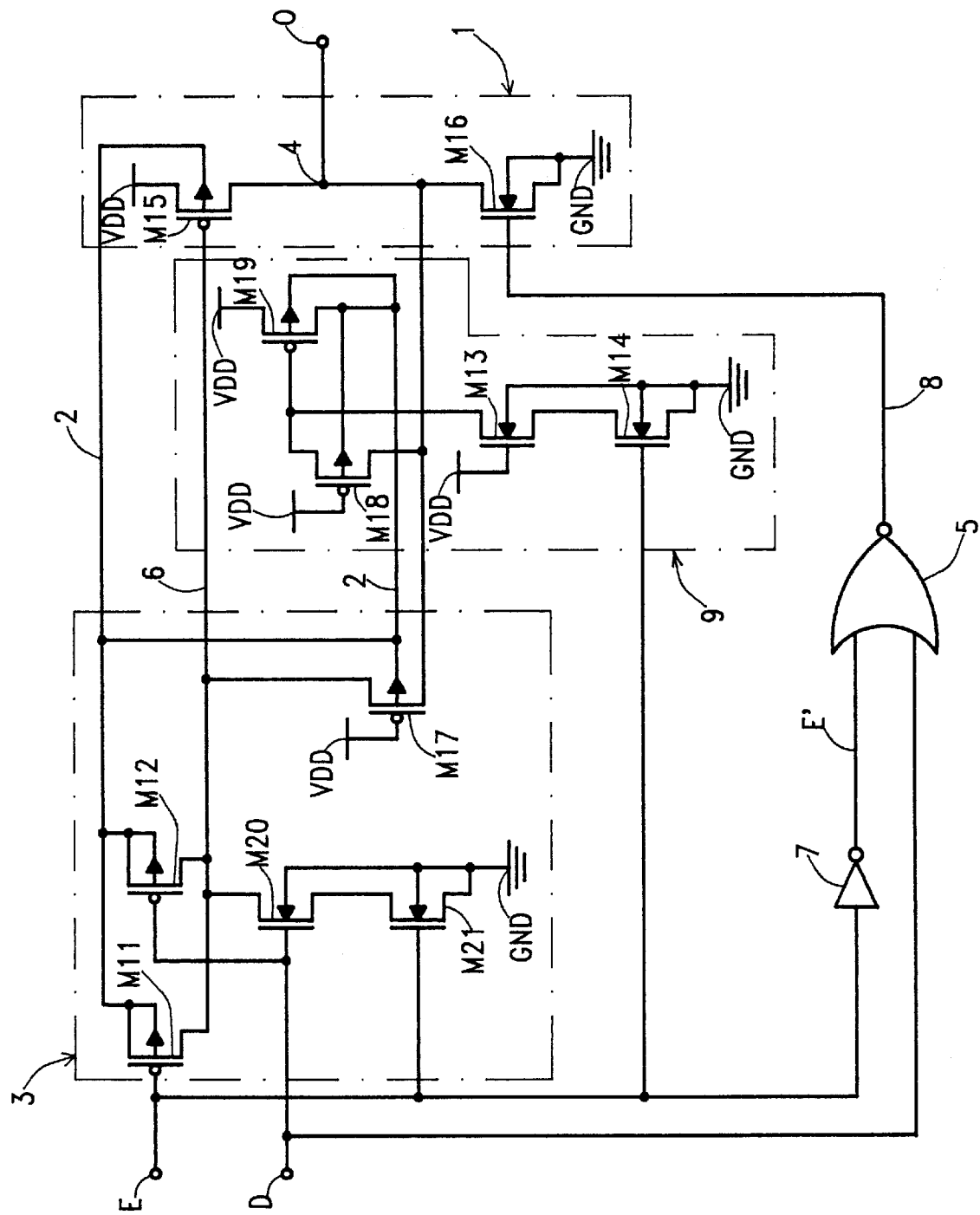

THREE-STATE CMOS OUTPUT BUFFER CIRCUIT

BACKGROUND OF THE INVENTION

1. Field of the Invention

The present invention relates to a three-state CMOS output buffer circuit.

2. Discussion of the Related Art

As known to anyone skilled in the art, conventional three state CMOS output buffer circuits include a CMOS final driving stage, which in turn includes a P-channel MOSFET (pull-up) and an N-channel MOSFET (pull-down) connected in Series between a voltage supply line (VDD) and a common ground (GND).

The circuits further include a control circuitry for the activation of the CMOS final driving stage; such a control circuitry mixes the input data signal with an enable/disable signal for the activation of the three-state (or high impedance) mode, in which both the MOSFETs of the final stage are off. In its most simple form, the control circuitry includes a NAND gate, at whose inputs the input data signal and the enable/disable signal are applied and whose output drives the gate of the P-channel pull-up, and a NOR gate, at whose inputs the input data signal and the enable/disable signal (complemented) are applied and whose output drives the gate of the N-channel pull-down.

It is also known that there is a trend towards reducing the value of the supply voltage. A few years ago the. standard for CMOS was 5 V, nowadays a lot of 3 V applications are found. It is also common to have electronic systems in which 3V-supplied boards are interfaced with 5 V-supplied boards. In the High-speed CMOS (HCMOS) logic family interface circuits are available which allow 3 V-supplied boards to be connected to a same bus as 5 V-supplied boards.

A 3 Volts integrated circuit which, in the three-state mode, is capable of sustaining a 5 Volts at its outputs, is said to be "5 Volts tolerant".

An integrated circuit with three-state output buffer circuits of the type described above and supplied at 3 V is not 5 Volts tolerant, i.e. it cannot be connected to a bus of signals driven at an higher voltage, for example 5 V, for the following reason: the P-channel pull-up formed inside an N type well constituting the so-called "bulk". The N-type well or bulk is connected to the voltage supply VDD, to prevent, in any operating condition, the junctions between the P-type source and drain regions of the P-channel pull-up and the bulk from being forward biased. If however the voltage supply VDD is 3 V and the voltage of the output of the final stage, i.e. the drain of the P-channel pull-up, can increase to a value of 5 V, the junction between the P-type drain of the P-channel pull-up and the bulk is forward biased, which causes a high leakage current to flow; such a current, being so high, can damage the integrated circuit.

This problem has been recognized for a long time, and solutions to it have been proposed. Some of these solutions are however not suitable for logic integrated circuits, because they involve the use of components working in the linear region, thus dissipating power.

In "Tips For Straddling The 3-V To 5-V Fence", Electronic Design, Apr. 4, 1994, 5-V tolerant three-state output buffer circuits are proposed that make use of Schottky diodes to block the leakage current. In one of the proposed solutions, the bulk of the P-channel pull-up is not connected to the voltage supply VDD directly, but through a Schottky diode; the bulk is further connected, through another Schottky diode, to the output node of the final driving stage.

The drawback of the these solutions is that they involve the use of BiCMOS (Bipolar CMOS) technologies, more expensive than the known CMOS or HCMOS technologies.

In the U.S. Pat. No. 5,270,589 (Toshiba) two output buffer circuit solutions are disclosed: in the first solution, an N-channel pass transistor is connected between the output node of the final stage (the drain of the P-channel pull-up) and the output pad; the gate N-channel pass transistor is driven by a voltage VDD' higher than VDD. This requires a second, external power supply line (which is impossible for devices having fixed pin number and configuration), or an on-chip charge pump to boost VDD to VDD'. The second solution is similar to the first solution, but the pass transistor is an N-channel depletion MOSFET with gate connected to VDD. The problem is that in some technologies depletion MOSFETs are not available.

In the U.S. Pat. No. 5,151,619 (IBM) an output buffer circuit is disclosed which makes use of a transmission gate with floating bulk to decouple the final stage from the remaining of the circuit.

In view of the state of the art described, it is an object of the present invention to provide a three-state CMOS output buffer circuit suitable for applications wherein integrated circuits with different voltage supplies must be interfaced, which is structurally different from and overcomes the drawbacks of the known circuits.

SUMMARY OF THE INVENTION

According to the present invention, these and other objects are attained by means of a three-state CMOS output buffer circuit comprising: a final amplifier stage comprising a pull-up transistor and a pull-down transistor connected between a voltage supply and ground and having a common output node; a control circuitry for driving the final amplifier stage comprising:

a first logic gate supplied with an input data signal and an enable/disable signal for activating a three-state mode in which the pull-up transistor and the pull-down transistor are both deactivated, the first logic gate driving the pull-up transistor;

a second logic gate supplied with the input data signal and enable/disable signal, the second logic gate driving the pull-down transistor, wherein the pull-up transistor has a bulk electrode connected to a switchable bulk line, and in that an auxiliary circuit is provided which as long as a voltage of the output node is not higher than the supply voltage keeps said switchable bulk line connected to the voltage supply, the first logic gate comprising means for transferring the voltage of the output node to the switchable bulk line when the voltage of the output node exceeds the supply voltage.

An output buffer circuit according to the present invention is 5 Volts tolerant, i.e. it makes possible to interface an integrated circuit supplied with, for example, 3 Volts to a same bus to which an integrated circuit supplied with 5 Volts is connected, without the risk of incurring high leakage currents when the output buffer is in the three-state mode and a 5 Volt signal is applied to the bus. In fact, the pull-up of the final stage has the bulk electrode connected to a line whose voltage is always the highest between the supply voltage of the integrated circuit comprising the output buffer and the voltage of the external bus signal line.

DESCRIPTION OF THE DRAWINGS

The features and advantages of the present invention will be made more evident by the following detailed description of the invention, illustrated as a non-limiting example in the single annexed drawing which is a circuit diagram of one particular embodiment of three-state CMOS output buffer circuit according to the present invention.

DETAILED DESCRIPTION

With reference to the annexed drawing, there is shown a three-state CMOS output buffer circuit according to one embodiment of the present invention. The circuit comprises, in a per-se known way, a final stage 1 comprising a pull-up P-channel MOSFET M15 and a pull-down N-channel MOSFET M16 connected in series between a voltage supply VDD (for example 3 V) and a common ground GND. More precisely, the pull-up M15 has its source connected to VDD and its drain connected to the drain of the pull-down M16, this last having its source connected to GND. The common node 4 of M15 and M16 forms an output data signal O of the buffer circuit. It is to be noted that, differently from conventional final stages, the bulk electrode of the P-channel pull-up M15 is not short-circuited to VDD, but is instead connected to a circuit node 2, which as will be described later on forms a switchable bulk line.

The buffer circuit further comprises a control circuitry for the activation of the final stage. The control circuitry comprises, in a per-se known way, a two-input NAND gate 3, with a first input connected to an enable/disable signal E, a second input connected to an input data signal D and an output 6 connected to the gate of the pull-up M15, and a NOR gate 5 with a first input connected to a logical complement E' of the enable/disable signal E (logical complement that is provided by an inverter 7), a second input connected to the input data signal D and an output 8 connected to the gate of the pull-down M16.

In the drawing, the detailed circuit structure of the two-input NAND gate 3 is shown; conventionally, the NAND gate 3 comprises two parallel-connected P-channel transistors M11, M12 in series with two serial-connected N-channel transistors M20, M21. However, the common source node of M11 and M12 is not connected to the voltage supply VDD, as in conventional buffer circuits, being instead connected to the switchable bulk line 2 to which the bulk of the pull-up M15 is also connected. Furthermore, the NAND gate 3 comprises a P-channel MOSFET M17 with gate connected to VDD, drain connected to the output 6 of the NAND gate, and source connected to the output node 4 of the final stage; the bulk electrode of M17 is connected to the circuit node 2.

According to the invention, the control circuitry comprises an auxiliary circuit 9. The auxiliary circuit 9 comprises a P-channel MOSFET M19 with source connected to VDD, drain and bulk connected to the circuit node 2 and gate connected to the drain of an N-channel MOSFET M13; this last has the gate connected to VDD and the source connected to the drain of another N-channel MOSFET M14 with source connected to ground and gate connected to the enable/disable signal E; the bulk of both M13 and M14 is connected to ground. A further P-channel MOSFET M18 with gate connected to VDD has the drain connected to the gate of M19, the source connected to the output node 4 and the bulk connected to the circuit node 2. The N-channel MOSFETs M13 and M14 forms a bias network for the P-channel MOSFET M19.

The operation of the three-state CMOS buffer of the present invention will be now given.

Firstly, it is assumed that the output buffer circuit is enabled (i.e. not in the three-state mode): the enable/disable signal E is high ("1"), and its complemented signal E' is low ("0"). In this condition, M14 is on, the source of M13 is tied to ground, and M13 is on; the gate of M19 is thus tied to ground, and M19 is on: circuit node 2 is thus connected, through M19, to VDD.

The output 6 of the NAND 3 and the output 8 of the NOR gate 5 are high or low depending on the logic state of the input data signal D. More precisely, if D="0" the output 8 is "1" and the output 6 is "1": the pull-up M15 is off and the pull-down M16 is on, and the output signal O is tied to ground (i.e. it is a logic "0"). If D="1 " the output 8 is "0" and the output 6 is "0": the pull-down M16 is off and the pull-up M15 is on, and the output O is tied to VDD (i.e. it is a logic "1").

The P-channel MOSFET M17 is off, since neither its source voltage nor its drain voltage can exceed its gate voltage (VDD) plus its threshold voltage Vth (in absolute value).

Also the P-channel MOSFET M18 is off, for the same reasons as M17.

Let's now assume that the output buffer circuit is disabled (i.e. in the three-state mode): E="0", E'="1", node 6 is tied to node 2 by M11 and M15 is off, also, the output 8 is low and M16 is off: both the pull-up M15 and the pull-down M16 of the final stage are off, thus node 4 is in a high-impedance condition.

M14 is off, so that the gate of M19 is left floating; however, the bulk of M19 is always at VDD: in fact, if M19, prior to entering the three-state mode, was in saturation, it remains in this condition because its gate capacitance does not have a discharge path; otherwise, the bulk of M19 will be biased at VDD by the parasitic source-bulk junction diodes of M19 and M15.

It is to be noted that, even if the gate of M19 is left floating, there is no static dissipation, because M19 has a purely capacitive load given by the bulk and, through M11, the input capacitance of M15.

If however another output buffer circuit supplied with a voltage higher than VDD (for example 5 V) and connected to the same output data signal line O to which the output node 4 is connected causes the voltage of O to exceed VDD+Vth, M17 turns on and transfers the voltage of O onto the output 6 of the NAND gate 3, which causes the pull-up M15 to turn off. Also, M18 turns on, so that the gate voltage of M19 raises toward the voltage of node O and M19 turns off; MOSFETs M11 and M12 transfer the voltage of node 6 to the switchable bulk line 2. In this way, the voltage of the bulk of M15 is made to coincide to the voltage of node O (higher than VDD). This prevents the drain-bulk junction of MOSFET M15 from being forward biased, and no leakage current flow.

It appears that the auxiliary circuit 9 substantially behaves as a diode between VDD and the switchable bulk line 2, biasing the bulk line 2 to VDD when the output is not higher than VDD, while NAND circuit 3 behaves as a diode between the node O and the switchable bulk line 2, biasing it to the voltage of the output when this exceeds VDD.

It is also to be noted that the bias network comprised of the N-channel MOSFETs M14 and M13 could be more simply implemented by a single N-channel MOSFET, driven by the signal E. However, by providing the further N-channel MOSFET M13, it is assured that no conductive paths are formed from the output node 4 to ground when the supply voltage VDD drops (power-down) while the signal E is high.

The three-state CMOS output buffer circuit of the present invention is rather simple, the number of transistors required being quite small. Furthermore, the circuit does not require external power supplies, and can be fabricated with low-cost HCMOS technologies.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A three-state CMOS output buffer comprising:
    a final amplifier stage comprising a pull-up transistor and a pull-down transistor connected between a voltage supply and ground and having a common output node; and
    control circuitry for driving the final amplifier stage comprising:
        a first logic gate supplied with an input data signal and an enable/disable signal for activating a three-state mode in which the pull-up transistor and the pull-down transistor are both deactivated, the first logic gate driving the pull-up transistor; and
        a second logic gate supplied with said input data signal and enable/disable signal, the second logic gate driving the pull-down transistor;
        wherein said pull-up transistor has a bulk electrode connected to a switchable bulk line; and
        wherein an auxiliary circuit is provided which as long as a voltage of the output node is not higher than a supply voltage of said voltage supply, keeps said switchable bulk line connected to the voltage supply;
        said first logic gate comprising means for transferring the voltage of the output node to said switchable bulk line when the voltage of the output node exceeds the supply voltage.

2. A three-state CMOS output buffer circuit comprising:
    a final amplifier stage comprising a pull-up transistor and a pull-down transistor connected between a voltage supply and ground and having a common output node; and
    control circuitry for driving the final amplifier stage comprising:
        a first logic gate supplied with an input data signal and an enable/disable signal for activating a three-state mode in which the pull-up transistor and the pull-down transistor are both deactivated, the first logic gate driving the pull-up transistor; and
        a second logic gate supplied with said input data signal and enable/disable signal, the second logic gate driving the pull-down transistor;
        wherein said pull-up transistor has a bulk electrode connected to a switchable bulk line; and
        wherein an auxiliary circuit is provided which, as long as a voltage of the output node is not higher than a supply voltage of said voltage supply, keeps said switchable bulk line connected to the voltage supply;
        wherein said auxiliary circuit comprises switching means which as long as the voltage of the output node is not higher than the supply voltage are activated to connect said switchable bulk line to the supply voltage, and driving means which when the voltage of the output node exceeds the supply voltage deactivate said switching means;
        said first logic gate comprising means for transferring the voltage of the output node to said switchable bulk line when the voltage of the output node exceeds the supply voltage.

3. The three-state CMOS output buffer circuit according to claim 2, wherein said switching means comprise a first transistor connected between the voltage supply and the switchable bulk line and having a bulk electrode connected to the switchable bulk line, and said driving means comprises a second transistor connected between the output node and a control electrode of the first transistor, and having a control electrode and a bulk electrode respectively connected to the voltage supply and to the switchable bulk line.

4. The three-state CMOS output buffer circuit according to claim 3, wherein the auxiliary circuit further comprises biasing means for biasing the first transistor in an on condition when the buffer circuit is not in the three-state mode.

5. The three-state CMOS output buffer circuit according to claim 4, wherein said biasing means comprises a third transistor coupled to the control electrode of the first transistor and to the ground, said third transistor being controlled by the enable/disable signal to be turned off in the three-state mode.

6. The three-state CMOS output buffer circuit according to claim 5, wherein said biasing means comprises a fourth transistor connected between the control electrode of the first transistor and the third transistor, and having a control electrode connected to the voltage supply.

7. The three-state CMOS output buffer circuit according to claim 3, wherein said first logic gate is a CMOS NAND gate and said means for transferring the voltage of the output node to the switchable bulk line comprise two transistors connected in parallel between said switchable bulk line and an output of the NAND gate which is connected to a control electrode of the pull-up transistor, said two transistors being respectively controlled by the input data signal and by the enable/disable signal, and a further transistor connected between the output node and said output of the NAND gate and having a gate electrode and a bulk electrode respectively connected to the voltage supply and the switchable bulk line.

8. A three-state CMOS output buffer comprising:
    an output stage comprising a pull-up transistor and a pull-down transistor coupled between a voltage supply and ground and having a common output node, said pull-up transistor having a bulk electrode coupled to a first node;
    a first logic gate having a first input for receiving an enable/disable signal for activating a three-state mode in which the pull-up transistor and pull-down transistor are both deactivated, a second input for receiving a data signal and an output connected to a control electrode of said pull-up transistor; and
    an auxiliary circuit for connecting said first node to said voltage supply when a first condition is satisfied, and for connecting said first node to said output node when a second condition is satisfied;
    said first logic gate including transfer circuitry for transferring an output voltage of the output node to said first node when said second condition is satisfied.

9. The three-state CMOS output buffer of claim 8, wherein said first condition is satisfied when said output voltage is less than a supply voltage of said voltage supply.

10. The three-state CMOS output buffer of claim 9, wherein said second condition is satisfied when said output voltage is greater than said supply voltage.

11. The three-state CMOS output buffer of claim 10 further comprising a second logic gate having a first input for receiving said enable/disable signal, a second input for receiving said data signal and an output connected to a control electrode of said pull-down transistor.

12. A three-state CMOS output buffer comprising:
an output stage comprising a pull-up transistor and a pull-down transistor coupled between a voltage supply and ground and having a common output node, said pull-up transistor having a bulk electrode coupled to a first node;
a first logic gate having a first input for receiving an enable/disable signal for activating a three-state mode in which the pull-up transistor and pull-down transistor are both deactivated, a second input for receiving a data signal and an output connected to a control electrode of said pull-up transistor; and
an auxiliary circuit for connecting said first node to said voltage supply when a first condition is satisfied, and for connecting said first node to said output node when a second condition is satisfied;
said first logic gate including transfer circuitry for transferring an output voltage of the output node to said first node when said second condition is satisfied;
wherein said first condition is satisfied when said output voltage is less than a supply voltage of said voltage supply;
wherein said second condition is satisfied when said output voltage is greater than said supply voltage;
wherein said auxiliary circuit comprises a first transistor connected between the power supply and the first node and having a bulk electrode connected to the first node and a second transistor connected between the output node and a control electrode of the first transistor, and having a control electrode connected to the voltage supply and a bulk electrode connected to the first node.

13. The three-state CMOS output buffer of claim 12, wherein said auxiliary circuit further comprises a biasing circuit for biasing the first transistor in an on condition when the buffer circuit is not in the three-state mode.

14. The three-state CMOS output buffer of claim 13, wherein said biasing circuit comprises a third transistor coupled to the control electrode of the first transistor and to ground, said third transistor having a control electrode for receiving said enable/disable signal, said third transistor being in an off condition when said buffer is in said three-state mode.

15. The three-state CMOS output buffer of claim 14, said biasing circuit further comprising a fourth transistor connected between the control electrode of the first transistor and the third transistor, and having a control electrode connected to the voltage supply.

16. The three-state CMOS output buffer of claim 15, wherein said first logic gate comprises a NAND gate having a fifth transistor and a sixth transistor connected in parallel between said first node and an output of said NAND gate, said NAND gate output being connected to said control electrode of said pull-up transistor, said fifth transistor having a control electrode connected to receive said enable/disable signal and said sixth transistor having a control electrode connected to receive said data signal;
wherein said fifth and sixth transistors comprise said transfer circuitry for transferring the output voltage to said first node when said second condition is satisfied.

17. The three-state CMOS output buffer of claim 16, further comprising a seventh transistor connected between said output node and the output of the NAND gate and having a control electrode connected to said voltage supply and a bulk electrode connected to said first node.

* * * * *